United States Patent
Alpert et al.

(10) Patent No.: US 7,464,356 B2
(45) Date of Patent: Dec. 9, 2008

(54) METHOD AND APPARATUS FOR DIFFUSION BASED CELL PLACEMENT MIGRATION

(75) Inventors: Charles Jay Alpert, Cedar Park, TX (US); Haoxing Ren, Austin, TX (US); Paul Gerard Villarrubia, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 317 days.

(21) Appl. No.: 11/304,955

(22) Filed: Dec. 15, 2005

(65) Prior Publication Data

US 2007/0143724 A1 Jun. 21, 2007

(51) Int. Cl.
*G06F 17/50* (2006.01)

(52) U.S. Cl. ............... 716/8; 716/9; 716/10; 716/11; 716/12; 716/13; 716/14

(58) Field of Classification Search .......... 716/2, 716/5, 6, 8–10, 12–14, 18, 21; 438/14
See application file for complete search history.

(56) References Cited

U.S. PATENT DOCUMENTS

| | | | | |
|---|---|---|---|---|
| 5,984,510 | A * | 11/1999 | Guruswamy et al. | 716/2 |
| 6,209,123 | B1 * | 3/2001 | Maziasz et al. | 716/14 |
| 6,223,332 | B1 * | 4/2001 | Scepanovic et al. | 716/10 |
| 6,269,469 | B1 * | 7/2001 | Pavisic et al. | 716/12 |
| 6,282,693 | B1 * | 8/2001 | Naylor et al. | 716/8 |
| 6,286,128 | B1 * | 9/2001 | Pileggi et al. | 716/18 |
| 6,324,674 | B2 * | 11/2001 | Andreev et al. | 716/12 |
| 6,338,972 | B1 * | 1/2002 | Sudhindranath et al. | 438/14 |
| 6,415,425 | B1 * | 7/2002 | Chaudhary et al. | 716/9 |
| 6,519,745 | B1 * | 2/2003 | Srinivas et al. | 716/5 |
| 6,557,145 | B2 * | 4/2003 | Boyle et al. | 716/2 |
| 6,618,846 | B2 * | 9/2003 | Cheng | 716/5 |
| 6,792,585 | B1 * | 9/2004 | Ku et al. | 716/10 |
| 6,900,088 | B2 * | 5/2005 | Nanjo et al. | 438/210 |
| 7,131,096 | B1 * | 10/2006 | Balsdon et al. | 716/13 |
| 7,178,122 | B2 * | 2/2007 | Kishibe | 716/10 |
| 7,243,323 | B2 * | 7/2007 | Williams et al. | 716/6 |
| 7,386,822 | B1 * | 6/2008 | Hu | 716/8 |
| 2004/0230931 | A1 * | 11/2004 | Barbee et al. | 716/10 |
| 2005/0235246 | A1 * | 10/2005 | Smith et al. | 716/21 |
| 2007/0033562 | A1 * | 2/2007 | Correale et al. | 716/10 |
| 2007/0204252 | A1 * | 8/2007 | Furnish et al. | 716/10 |
| 2008/0066037 | A1 * | 3/2008 | Alpert et al. | 716/9 |

OTHER PUBLICATIONS

Ren et al.; "Diffusion-based placement migration"; Jun. 13-17, 2005; Design Automation Conference, 2005. Proceedings. 42nd; pp. 515-520.*

Ren et al.; "Diffusion-Based Placement Migration With Application on Legalization"; , Dec. 2007; Computer-Aided Design of Integrated Circuits and Systems, IEEE Transactions on; vol. 26, Issue 12pp. 2158-2172.*

Luo et al.; "Computational geometry based placement migration"; Nov. 6-10, 2005; Computer-Aided Design, 2005. ICCAD-2005. IEEE/ACM International Conference on; pp. 41-47.*

* cited by examiner

*Primary Examiner*—Helen Rossoshek
(74) *Attorney, Agent, or Firm*—Mitch Harris, Atty at Law, LLC; Andrew M. Harris; Casimer K. Salys (57) ABSTRACT

A method for cell placement in an integrated circuit design that uses a calculated diffusion velocity determined from a density value in order to relocate the cells until the cell placement reduces the density below a predetermined threshold. The method acts to control the movement of different cells to reduce the density of the cells prior to legalization of the cell placement.

7 Claims, 8 Drawing Sheets

|  | $d_{3,6} = 1.0$ | $d_{4,6} = 0.2$ |  |
|---|---|---|---|
| $d_{2,5} = 1.2$ | $d_{3,5} = 0.4$ | $d_{4,5} = 0.8$ | $d_{5,5} = 0.6$ |
| $d_{2,4} = 1.4$ | $d_{3,4} = 0.8$ | $d_{4,4} = 1.0$ | $d_{5,4} = 1.0$ |
|  | $d_{3,3} = 1.6$ | $d_{4,3} = 1.0$ | $d_{5,3} = 1.0$ |

METHOD AND APPARATUS FOR DIFFUSION BASED CELL PLACEMENT MIGRATION

BACKGROUND

1. Technical Field of the Present Invention

The present invention generally relates to the design of integrated circuits, and more specifically, to the placement of cells within the design.

2. Description of Related Art

Integrated circuits have a large number of electronic components (millions of transistors) and are fabricated using several layers of different materials placed on a silicon base or wafer. The design of an integrated circuit involves transforming a description of the electrical components into geometrical representations known as a layout. The layout has a set of planar geometric shapes in each of the various layers of materials.

The process of transforming the description of the electrical components into a layout is called the physical design. Physical design involves arranging elements, wires, and predefined cells on a fixed area. Due to the large number of components and the exacting details required by the fabrication process, physical design is not practical without the aid of computers. As a result, most phases of physical design use Computer Aided Design (CAD) tools.

The object of the physical chip design is to determine an optimal arrangement for devices residing on a plane and to find an efficient interconnection or routing scheme between the devices to obtain the desired functionality. Since space on the chip surfaces are at a premium, algorithms for this placement must use this space very efficiently in order to lower costs and improve yield. The arrangement of individual cells in an integrated circuit is known as cell placement.

Placement migration is the movement of cells within an existing placement to address a variety of post-placement design closure issues such as timing, routing congestion, signal integrity, and heat distribution. Any movement by the cells during placement migration must be performed so as to minimize the disruption to the original placement as little as possible.

A placement is considered "illegal" if cells overlap or fail to align with circuit rows. The term "legalization" is used to describe the process of taking an illegal placement and disrupting the layout to make it "legal" while minimizing any disruptions so as to preserve as near as possible the desired characteristics of the original illegal placement.

Existing techniques for performing legalization include network flow, heuristic ripple cell movement, dynamic programming, and single row optimization. Although these techniques accomplish the legalization of the cell placement, they do so at a cost that disrupts the original cell placement more than is optimally desired.

It would, therefore, be a distinct advantage to have a method and apparatus that implements a legalization technique in a more continuous manner than the prior art methods.

SUMMARY OF THE PRESENT INVENTION

In one aspect, the present invention is a method of placing cells in an integrated circuit design. The method includes the step of defining grid locations for the design, the grid locations having a predetermined size and shape. The method also includes the step of calculating a density value for the grid locations according to the number of cells located within the grid. The method further includes the step of calculating the velocity for the cells using the density values of the grid locations. The method also includes the step of moving the cells according to their calculated velocity until the density value of each one of the grid locations is less than or equal to the predetermined density.

BRIEF DESCRIPTION OF THE DRAWINGS

The present invention will be better understood and its numerous objects and advantages will become more apparent to those skilled in the art by reference to the following drawings, in conjunction with the accompanying specification, in which.

DETAILED DESCRIPTION OF THE PREFERRED EMBODIMENT OF THE PRESENT INVENTION

The present invention is a method, apparatus, and computer program product that use the principles of diffusion for cell placement in an integrated circuit design. More specifically, the present invention implements a diffusion based model, as described herein, that moves each cell a small amount during a given time period (step) according to its local density gradient. As the number of times the diffusion process is followed increases, the placement proceeds closer towards equilibrium.

The present invention is described below in connection with cell placement migration techniques in order to facilitate the ease with which the present invention can be explained and understood. It is not, however, to be considered a limitation on the applicability of diffusion method to other cell placement techniques.

Cell placement is considered "illegal" if cells overlap or fail to align with specified circuit rows. The term "legalization" describes the process of taking an illegal placement and disrupting the layout until it is legal. The goal of legalization is to perform this disruption while maintaining the desired characteristics of the illegal placement as much as possible.

Diffusion Principle

In diffusion, materials from highly concentrated areas flow into less concentrated areas and are driven by the concentration gradient (i.e., slope and steepness of the concentration difference at a given point). The concentration of a cross section of unit area over time is simply the difference between the material flow into and out of the cross section. Mathematically, the relationship of material concentration with time and space can be described by equation one (1)

$$\frac{\partial d_{x,y}(t)}{\partial t} = D\nabla^2 d_{x,y}(t)$$

where $d_{x,y}(t)$ is the material concentration at position (x, y) at time t and D is the diffusivity which determines the speed of diffusion. In order to simplify the following explanation, it can be assumed that D=1. Equation one states that the speed of density change is linear with respect to its second order gradient over the density of space. This implies that elements migrate with increased speed when the local density gradient is higher. In the context of placement, cells will move quicker when their local density neighborhood has a steeper gradient.

When the region for diffusion is fixed (as in cell placement), the boundary conditions are defined as $\nabla d_{x_b, y_b}(t)$ for coordinates $(x_b, y_b)$ on the chip boundary. The coordinates for residing over fixed blocks are also defined in the same manner in order to prevent cells from diffusing on top of fixed blocks.

In diffusion, a cell migrates from an initial location to its final equilibrium location via a non-direct route. This route can be captured by a velocity function that gives the velocity of a cell at every location in the circuit for a given time t. This velocity at a certain position and time is determined by the local density gradient and the density itself. Obviously, a sharp density gradient causes cells to move faster. For every potential (x, y) location, a two-dimensional velocity field $v_{x,y} = (v^H_{x,y}, v^V_{x,y})$ of diffusion at time t is defined by equation set two (2)

$$v^H_{x,y}(t) = -\frac{\partial d_{x,y}(t)}{\partial x} \bigg/ d_{x,y}(t)$$

$$v^V_{x,y}(t) = -\frac{\partial d_{x,y}(t)}{\partial x} \bigg/ d_{x,y}(t)$$

Given this equation, and a starting location (x(0), y(0)) for a particular location, one can find the new location (x(t), y(t)) for the element at time t by integrating the velocity field as follows in equation set three (3):

$$x(t) = x(0) + \int_0^t v^H_{x(t'),y(t')}(t')\, dt'$$

$$y(t) = y(0) + \int_0^t v^V_{x(t'),y(t')}(t')\, dt'$$

Equations one, two, and three can be used to simulate the diffusion process. Given any particular element, these equations can be used to find the new location of the element at any point in time t. This paradigm can be applied to cell placement by migrating from a continuous space to a discrete place since cells have various rectangular sizes and the placement itself is discrete.

Diffusion Based Model Placement

Binning

The continuous coordinates of cell placement can be organized by dividing the cell placement areas into equal sized bins indexed by (j, k). For ease of explanation, the coordinate system is scaled so that the width and height of each bin is one such that location (x, y) is located inside bin (j, k) (|x|, |y|). The continuous time can also be broken into steps to $n\Delta t$, where $\Delta t$ is the size of the discrete time step.

Bin Density

Instead of the continuous density $d_{x,y}$, the density is now described in the context of the density $d_{j,k}$ of bin (j, k). The initial density $d_{j,k}(0)$ of each bin (j, k) can be defined as $d_{j,k}(0) = \Sigma \hat{A}_i$ where $\hat{A}_i$ is the overlapping area of cell i and bin (j, k).

Again, for ease of explanation, it can be assumed that if a fixed block overlaps a bin, it overlaps the bin in its entirety. In these cases, the bin density is defined to be one so that cells are prevented from diffusing on top of fixed blocks.

It can also be assumed for the moment that density $d_{j,k}(n)$ has already been calculated for time n. The next step is to find how the density changes and cells move for the next time step n+1. The Forward Time Centered Space (FTCS) scheme can be used to reformulate equation one. The new bin density is give by equation four:

$$d_{j,k}(n+1) = d_{j,k}(n) + \frac{\Delta t}{2}(d_{j+1,k}(n) + d_{j-1,k}(n) - 2d_{j,k}(n)) +$$
$$\frac{\Delta t}{2}(d_{j,k+1}(n) + d_{j,k-1}(n) - 2d_{j,k}(n))$$

The new density of a bin at time n+1 is dependent on its density and the density of its four neighbor bins. The degree of migration out of (or into) the bin is proportional to its local gradient.

Figure 1:
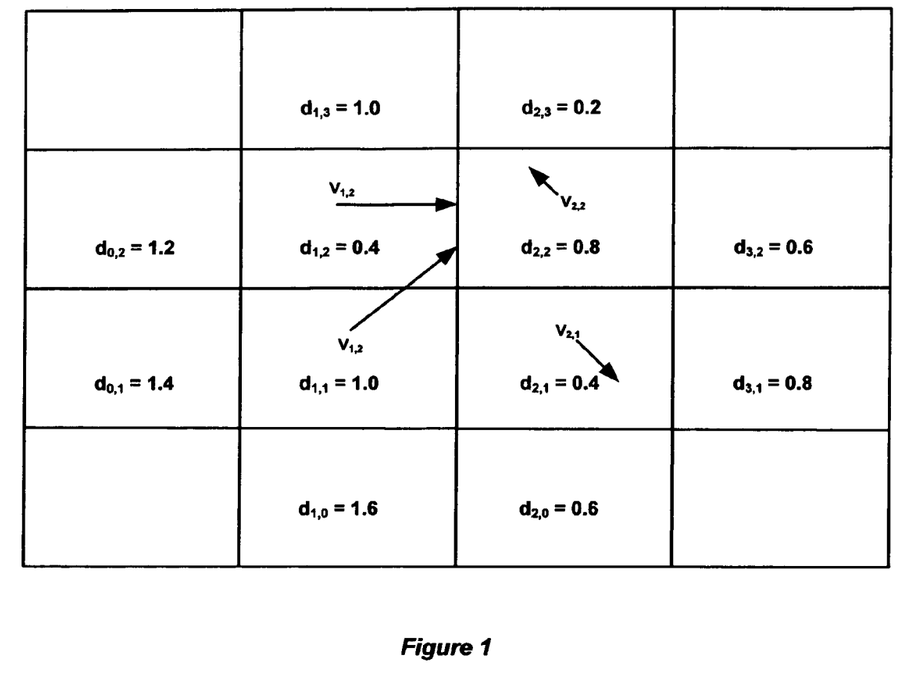
FIG. 1 is a diagram illustrating an example of the binning of cell coordinates and their respective density and velocity at a given time according to the teachings of the present invention.

Reference now being made to FIG. 1, a diagram is shown illustrating an example of the binning of cell coordinates and their respective density and velocity at a given time according to the teachings of the present invention. In this example, it can be assumed that $\Delta t=0.2$ and the density of bin (1,1) at time n+1 is given by the following equation:

$$d_{1,1}(n+1) = d_{1,1}(n) + 0.2/2(d_{2,1}(n) + d_{0,1}(n) - 2d_{1,1}(n)) +$$
$$0.2/2(d_{1,2}(n) + d_{1,0}(n) -= 2d_{1,1}(n)) = 0.98$$

Cell Velocity

In a similar fashion, equation two can be reformulated to calculate the velocity for cells inside each of the bins. For now, assume that each cell in a bin is assigned the same velocity, the velocity for each bin represented by equation set five:

$$v^H_{j,k}(n) = \frac{-d_{j+1,k}(n) - d_{j-1,k}(n)}{2d_{j,k}(n)}$$

$$v^v_{j,k}(n) = \frac{-d_{j,k+1}(n) - d_{j,k-1}(n)}{2d_{j,k}(n)}$$

The horizontal (vertical) velocity is proportional to the differences in density of the two neighboring horizontal (vertical) bins. For example, the velocity for bin (1,1) in FIG. 1 is given by the solving equation set five as follows:

$$v_{1,1}^H(n) = \frac{-d_{2,1} - d_{0,1}(n)}{2d_{1,1}(n)} = \frac{-0.4 - 1.4}{2(1.0)} = 0.5$$

$$v_{j,k}^V(n) = \frac{-d_{j,k+1}(n) - d_{j,k-1}(n)}{2d_{j,k}(n)} = \frac{-0.4 - 1.6}{2(1.)} = 0.6$$

Similarly, densities for other bins are given by $v_{1,2}$=(0.5, 0), $v_{2,1}$=(0.25, −0.25) and $v_{2,2}$=(−0.125, 0.125). It should be noted that bin (1, 2) has no vertical velocity component since the densities both above and below are equal to 1.0. In order to ensure that fixed cells and bins outside the boundary do not move, $v^V$ is set equal to 0 at a horizontal boundary and $v^H$ is set equal to 0 at a vertical boundary.

Cell Velocity Interpolation

Unfortunately, assuming that each cell in a bin has the same velocity fails to distinguish between the relative locations of cells within a bin. In addition, two cells that are right next to each other but in different bins can be assigned very different velocities, which could change their relative ordering. Since the goal of cell placement migration is to preserve the integrity of the original cell placement, this behavior must be altered. The present invention alters this behavior by applying velocity interpolation to generate velocity for any given (x, y).

In example, (p, q) exists such that the four closest bin centers to (x, y) are (p, q), (p+1, q), (p, q+1), and (p+1, q+1). Let $\kappa$=x+0.5−[x+0.5] and $\beta$=y+0.5−[y+0.5]. if $\kappa$=$\beta$=0, then (x, y) is located at the center of bin (p, q) and its velocity is given velocity $v_{p,q}$.

Figure 2:
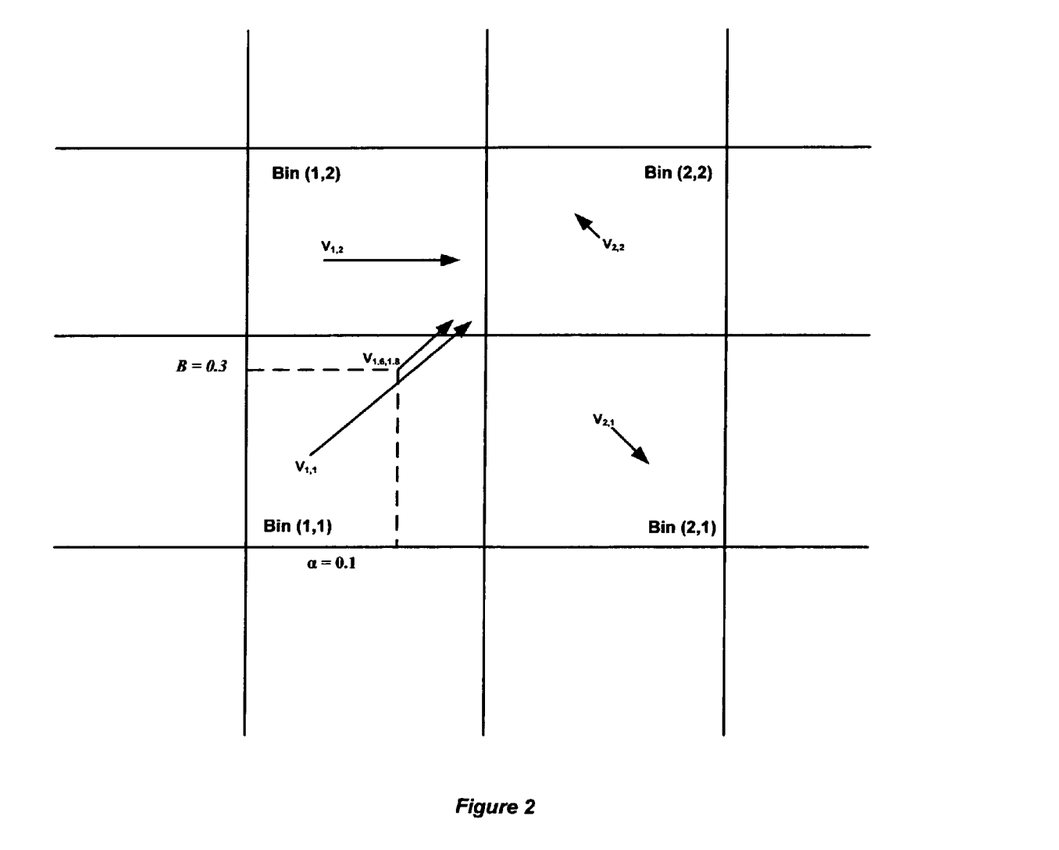
FIG. 2 is a diagram illustrating in greater detail the velocity of four bins of FIG. 1 according to the teachings of the present invention.

Reference now being made to FIG. 2, a diagram is shown illustrating in greater detail the velocity of four bins ((1,2), (2,2), (1,1) and (2,1) of FIG. 1 according to the teachings of the present invention. As shown, the bin velocity is marked at the center of each bin. The velocities at its four closest centers interpolate the velocity for a point inside a bin. The velocity for cell (x, y) (denoted by ($v_{x,y}^H$, $v_{x,y}^V$)) is given by the equation set six:

$$v_{x,y}^H = v_{p,q}^H + \kappa (v_{p+1,q}^H - v_{p,q}^H) +$$
$$\beta(v_{p,q+1}^H - v_{p,q}^H) + \kappa \beta(v_{p,q}^H + v_{p+1,q+1}^H - v_{p+1,q}^H - v_{p,q+1}^H)$$
$$v_{x,y}^V = v_{p,q}^V + \kappa (v_{p+1,q}^V - v_{p,q}^V) + \beta(v_{p,q+1}^V - v_{p,q}^V) +$$
$$\kappa \beta(v_{p,q}^H + v_{p+1,q+1}^H - v_{p+1,q}^H - v_{p,q+1}^H)$$

An example location (x=1.6, y=1.8) on FIG. 2, shows a $\kappa$=0.1 and $\beta$=0.3. The velocity for this point is given by:

$$v_{1.6,1.8}^H = v_{1,1}^H + 0.1(v_{2,1}^H - v_{1,1}^H) +$$
$$0.3(v_{1,2}^H - v_{1,1}^H) + 0.03(v_{1,1}^H + v_{2,2}^H - v_{2,1}^H - v_{1,2}^H) = 0.45625$$

$$v_{1.6,1.8}^V = v_{1,1}^V + 0.1(v_{2,1}^V - v_{1,1}^V) + 0.3(v_{1,2}^V - v_{1,1}^V) +$$
$$0.03(v_{1,1}^V + v_{2,2}^V - v_{2,1}^V - v_{1,2}^V) = 0.40175$$

Since the velocity for each cell can be determined at time n=t/Δt, the new placement of each cell can be calculated using a reformation of equation set three. In example, assume that the velocity for (x (n), y (n)) has already been calculated.

Using Taylor expansion allows the calculation of x (n+1), y (n+1) in equation set seven:

$$x(n+1) = x(n) + v_{x(n),y(n)}^H * \Delta t$$

$$y(n+1) = y(n) + v_{x(n),y(n)}^V * \Delta t$$

Diffusion Based Legalization Model

Figure 3:
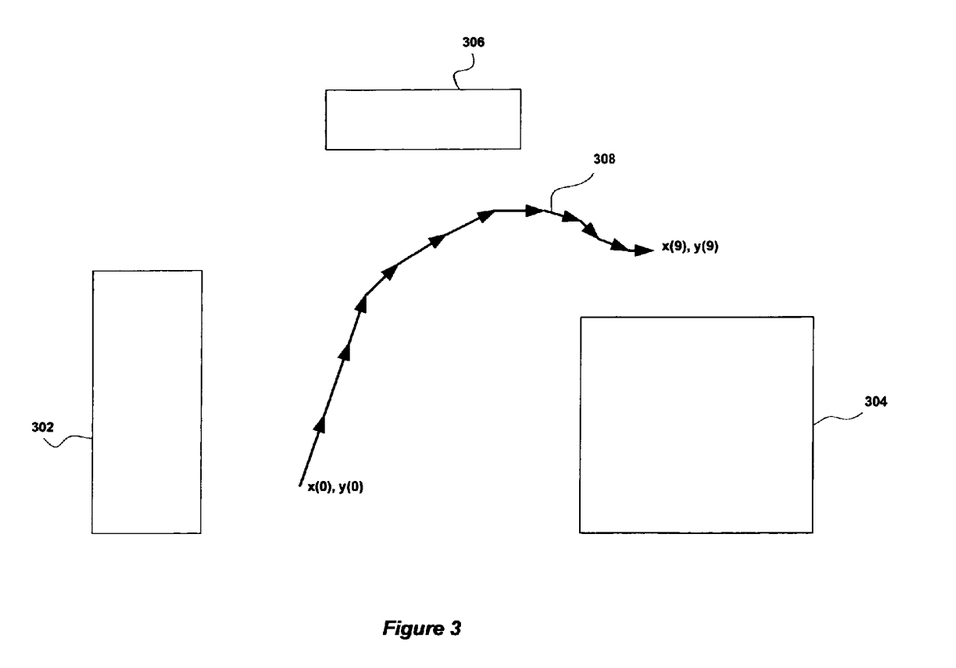
FIG. 3 is a diagram illustrating an example of a cell at a specified location migrating to different location using the diffusion method of the present invention.

Reference now being made to FIG. 3, a diagram is shown illustrating an example of a cell at location (x(0), y(0)) migrating to location (x(9), y(9)) using the diffusion method of the present invention. Blocks 302-306 represent fixed blockages and reference 308 shows the movement of the cell from initial position x(0), y(0) to x(9), y(9) using nine discrete time steps according to the equations above. From the path of the cell, it becomes apparent that the cell never overlapped a blockage 302-306 and the magnitude of its movements became smaller toward the tail of its path.

The term $d_{max}$ is used to specify the maximum allowed cell density of a bin (commonly equal to 1). Placement is considered close to legal if the cell density of every bin is less than or equal to the value of $d_{max}$. The goal of legalization is to reduce the density of those bins that are greater than $d_{max}$ to a density that is equal to or less than $d_{max}$ (i.e. migrating cells to less dense bins where required) while keeping the cells as close as possible to their original locations and preserving the ordering induced by the original placement during their migration.

In order to legalize a design each bin must have a density $d_{j,k}$ <= $d_{max}$. The existing placement of a design is designated with locations ($x_i$, $y_i$) for each cell i, N placement bins, and a maximum bin density of $d_{max}$.

Since the diffusion process reaches equilibrium when each bin has the same density, it can be expected that the final density after diffusion will be the same as the average density $\Sigma d_{j,k}/N$. Unfortunately, this may cause unnecessary spreading of cells, especially, if the average density is well below the maximum density constraint.

For example, once every bin is below the maximum density constraint, diffusion can cause additional spreading even though the requirements for legalization have been met. This spreading will unnecessarily disrupt the placement. In order to avoid unnecessary spreading, the initial density values of those bins under the maximum density will be increased prior to calculating the diffusion of the cells. More specifically, those bins having a density that is less than $d_{max}$ are artificially increased so that the average density equals $d_{max}$ prior to beginning the diffusion calculations. One way to adjust $d_{j,k}$ is as follows with equation eight:

$$\tilde{d}_{j,k} = \begin{cases} d_{max} - (d_{max} - d_{j,k})A_0/A_s & d_{j,k} < d_{max} \\ d_{j,k} & d_{j,k} >= d_{max} \end{cases}$$

where $A_o$ is the total area over $d_{max}$ and $A_s$ is total area less than $d_{max}$ (i.e., the available space to hold $A_o$ after spreading). This can be validated with the following equation:

$$\frac{\Sigma \tilde{d}j,k}{N} = d_{max}$$

Figure 4:
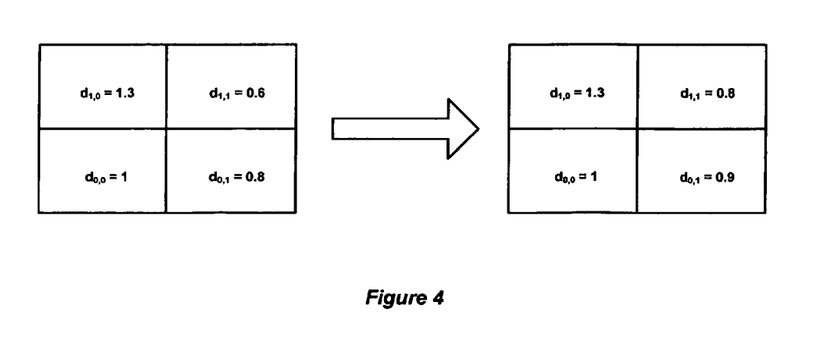
FIG. 4 is a drawing illustrating the modification of an original density map to a new density map according to the teachings of the present invention.

Reference now being made to FIG. 4, a drawing is shown illustrating the modification of an original density map 402 to a new density map 404 according to the teachings of the present invention. Density map 402 represents a 2×2 bin. The $d_{1,0}$ bin has a density of 1.3 and is over the maximum allowed density of 1, $d_{1,1}$ and $d_{0,1}$ bins have densities less than 1, and bin $d_{0,0}$ has a density equal to 1. In applying equation eight, $A_{0,0}=d_{1,0}-1=0.3$ and $A_s=(1-d_{1,1})+(1-d_{0,1})=0.6$. Density map 404 is the result of adjusting the two bins ($d_{1,1}$ and $d_{0,1}$) in accordance with equation eight.

$$\frac{\tilde{d}_{0,0} + \tilde{d}_{0,1} + \tilde{d}_{1,0} + \tilde{d}_{1,1}}{4} = 1.$$

$\tilde{d}_{j,k}$ will be used as the initial condition (t=0) for the diffusion equation four. The equation below represents equation nine.

$$d_{j,k}(0) = \tilde{d}_{j,k}.$$

At the boundary of the chip or a fixed macro, there is no diffusion between the sides of the boundary. Consequently, the densities on both sides need to be the same to assure the density gradient is zero when calculating equation four. On a horizontal boundary, $d_{j,k+1}(n)=d_{j,k-1}(n)$ if bin (j, k) is on the lower side of the boundary, or $d_{j,k-1(n)}=d_{j,k+1}(n)$ if on the upper side. On a vertical boundary, $d_{j+1,k}(n)=d_{j-1,k}(n)$ if on the left side, or $d_{j-1,k}(n)=d_{j+1,k}(n)$ if on the right side.

Figure 5:
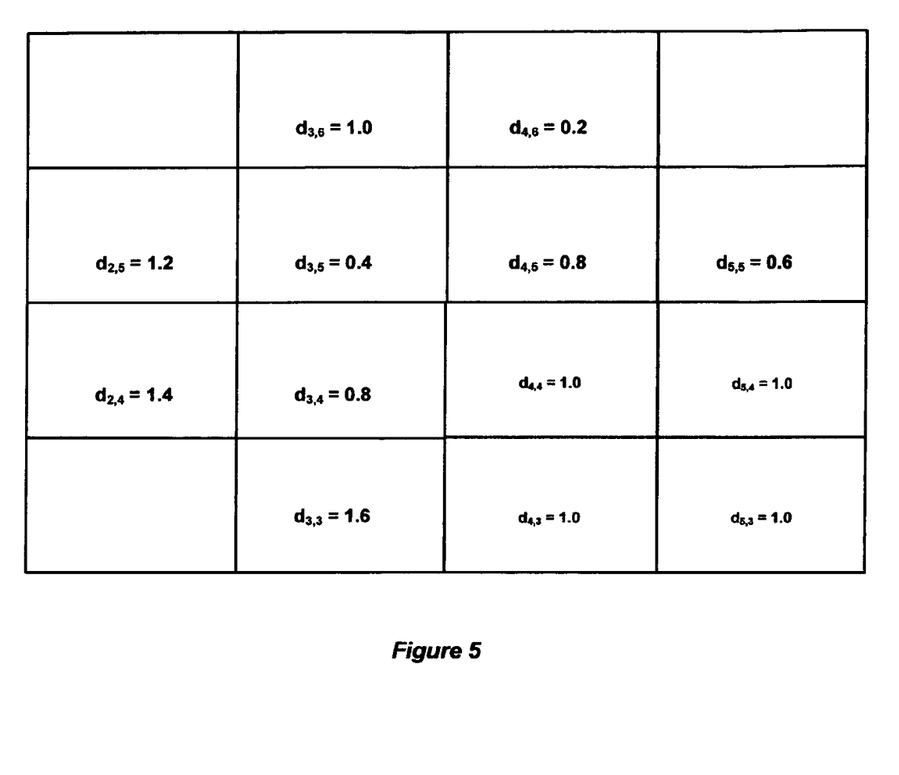
FIG. 5 is a diagram illustrating an example of a plurality of bins having density values for time n for demonstrating chip boundary and macro handling according to the teachings of the present invention.

Reference now being made to FIG. 5, a diagram is shown illustrating an example of a plurality of bins having density values for time n for demonstrating chip boundary and macro handling according to the teachings of the present invention. In this example, it can be assumed that $\Delta t=0.2$ and bins (4, 3), (5, 3), (4, 4) and (5, 4) are fixed. Bin (3, 4) is on the left vertical boundary of the fixed macro, while bin (4, 5) is on the upper horizontal boundary. When calculating $d_{3,4}(n+1)$ $d_{4,4}(n)$ is made to equal $d_{2,4}(n)$ and equation four becomes:

$$d_{3,4}(n+1) = d_{3,4}(n) + \frac{0.2}{2}(d_{2,4}(n) + d_{2,4}(n) - 2d_{2,3}(n)) +$$
$$\frac{0.2}{2}(d_{3,5}(n) + d_{3,3}(n) - 2d_{3,4}(n)) = 0.96$$

Similarly, when calculating $d_{4,5}(n+1)$ $d_{4,4}(n)$ is made to equal $d_{4,6}(n)$ and equation four becomes:

$$d_{4,5}(n+1) = d_{4,5}(n) + \frac{0.2}{2}(d_{3,5}(n) + d_{5,5}(n) - 2d_{4,5}(n)) +$$
$$\frac{0.2}{2}(d_{4,6}(n) + d_{4,6}(n) - 2d_{4,5}(n))$$
$$= 0.62$$

The density of bins inside of the fixed macros remains unmodified.

Figure 6:
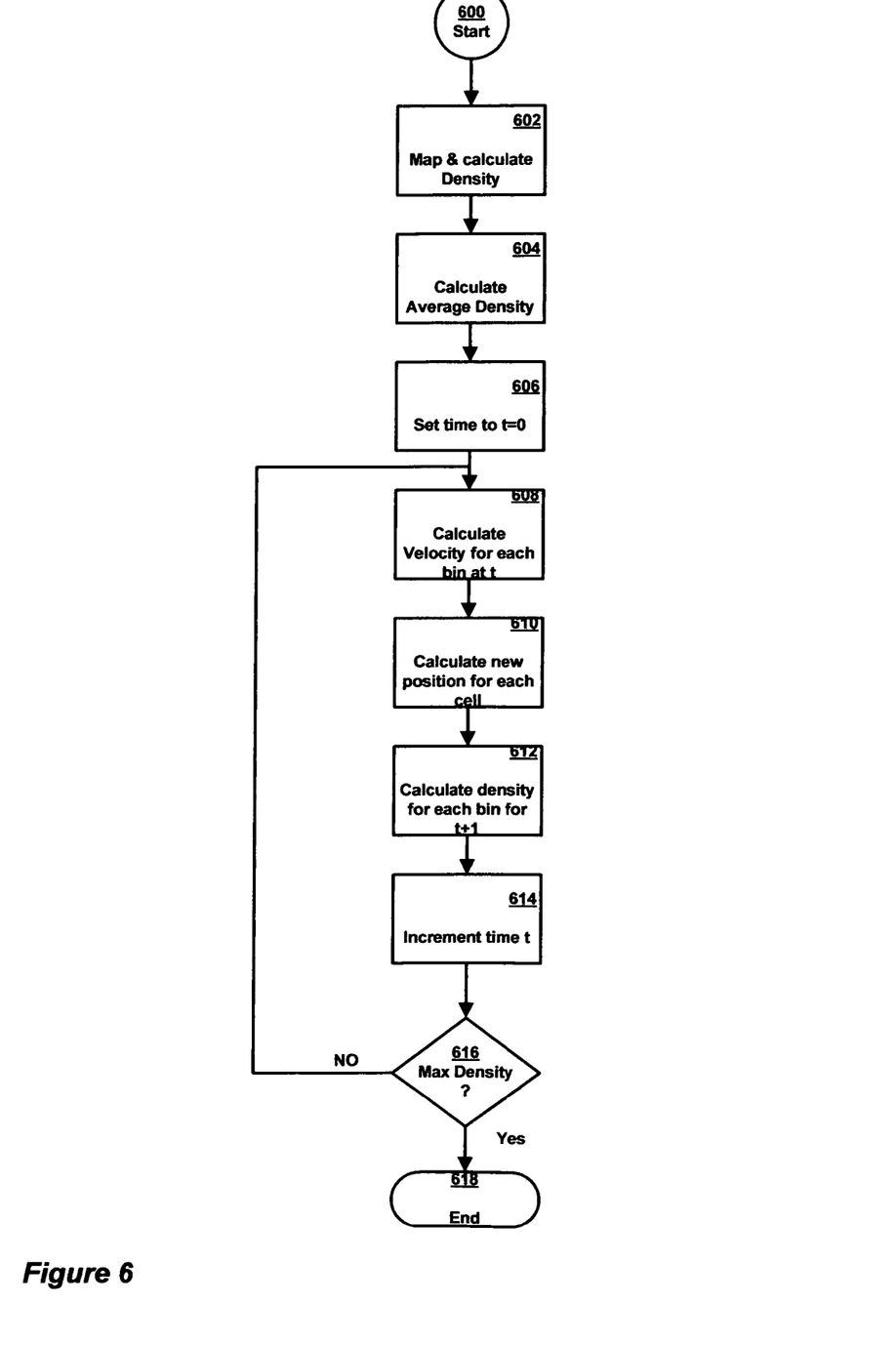
FIG. 6 is a flow chart illustrating the method for using diffusion to perform cell placement migration for legalization according to the teachings of the present invention.

Reference now being made to FIG. 6, a flow chart is shown illustrating the method for using diffusion to perform cell placement migration for legalization according to the teachings of the present invention. The method begins by gathering cell locations ($x_i$, $y_i$), the number of bins (N), and the maximum density ($d_{max}$) for this particular design (step 600). The cells are then mapped onto the bins and the density ($d_{j,k}$) is calculated for each bin (j, k) (step 602). If required, the density of the bins (j, k) are manipulated as previously described in connection with FIG. 4 to have an overall average density of $d_{max}$ (step 604). The time variable is set to time zero and the velocity is calculated for each of the bins (j, k) using equation set five (Steps 606 and 608). The location of each cell is then calculated using velocity and interpolation (equations 7 and 6 respectively) (step 610). The density is calculated at t+1 for each bin using equation four (step 612), and the time variable is increased by one (step 614).

If the density of each of the bins is less than or equal to $d_{max}$ then the method ends at step 618; otherwise, the method proceeds back to step 608 and repeats the process from that point.

After the diffusion process described above has been completed, the cell placement will have a maximum density of $d_{max}$ and is roughly legal. Any well-known legalization tool can be executed on the cell placement to put cells onto circuit rows without overlap.

Figure 7:
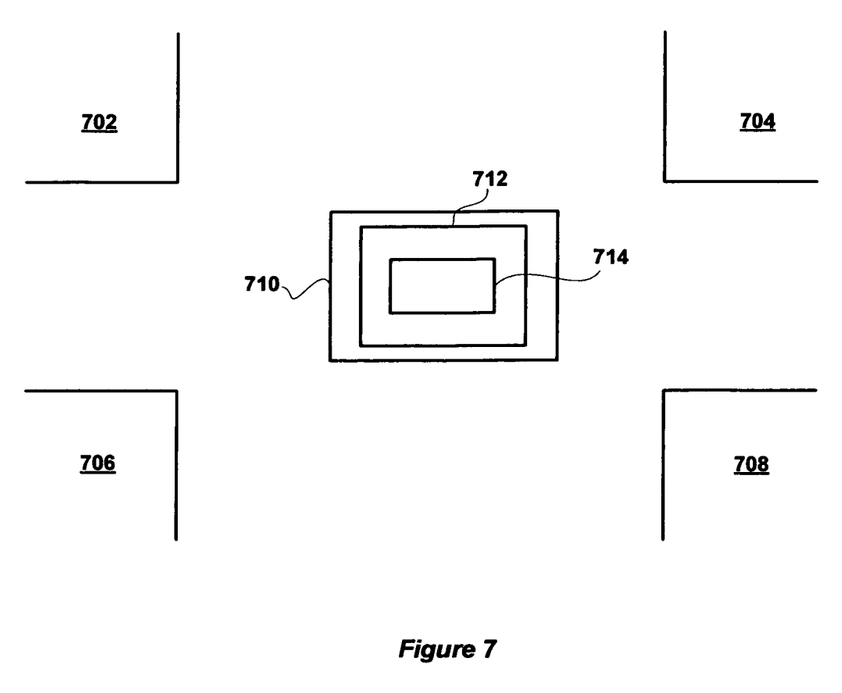
FIG. 7 is a diagram illustrating an example that requires cell placement.

Reference now being made to FIG. 7, a diagram is shown illustrating an example that requires cell placement. Blocks 702-708 represent fixed blocks and designators 710-714 represent various layers and densities of cells.

Figure 8:
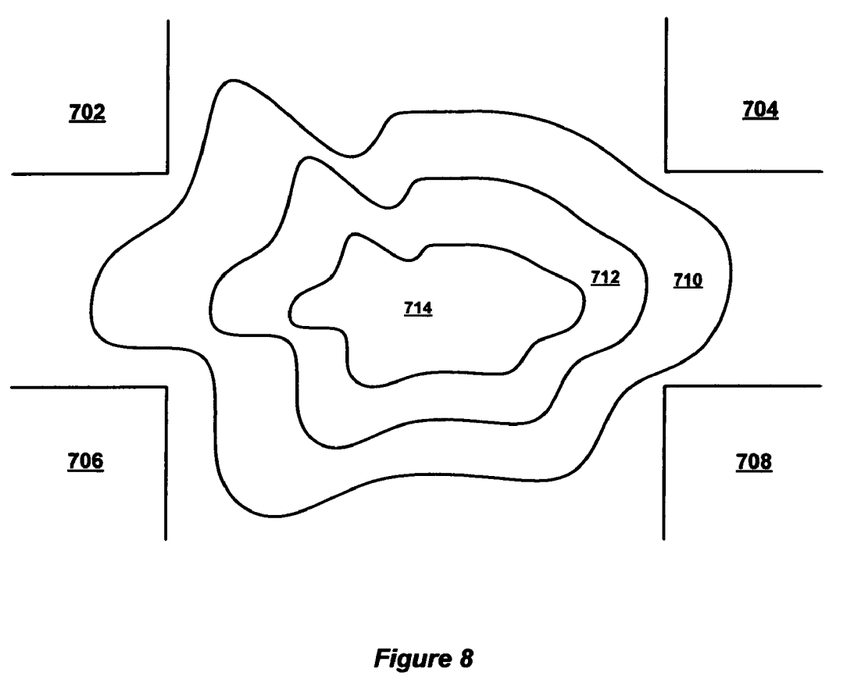
FIG. 8 is a diagram illustrating the cells of FIG. 7 after the diffusion cell placement method of FIG. 6 has been applied according to the teachings of the present invention.

Reference now being made to FIG. 8, a diagram is shown illustrating the cells of FIG. 7 after the diffusion cell placement method of FIG. 6 has been applied according to the teachings of the present invention. As can be seen, cell layers 710-714 have spread out without interfering with the fixed blocks 702-708 and meeting the required maximum density.

Figure 9:
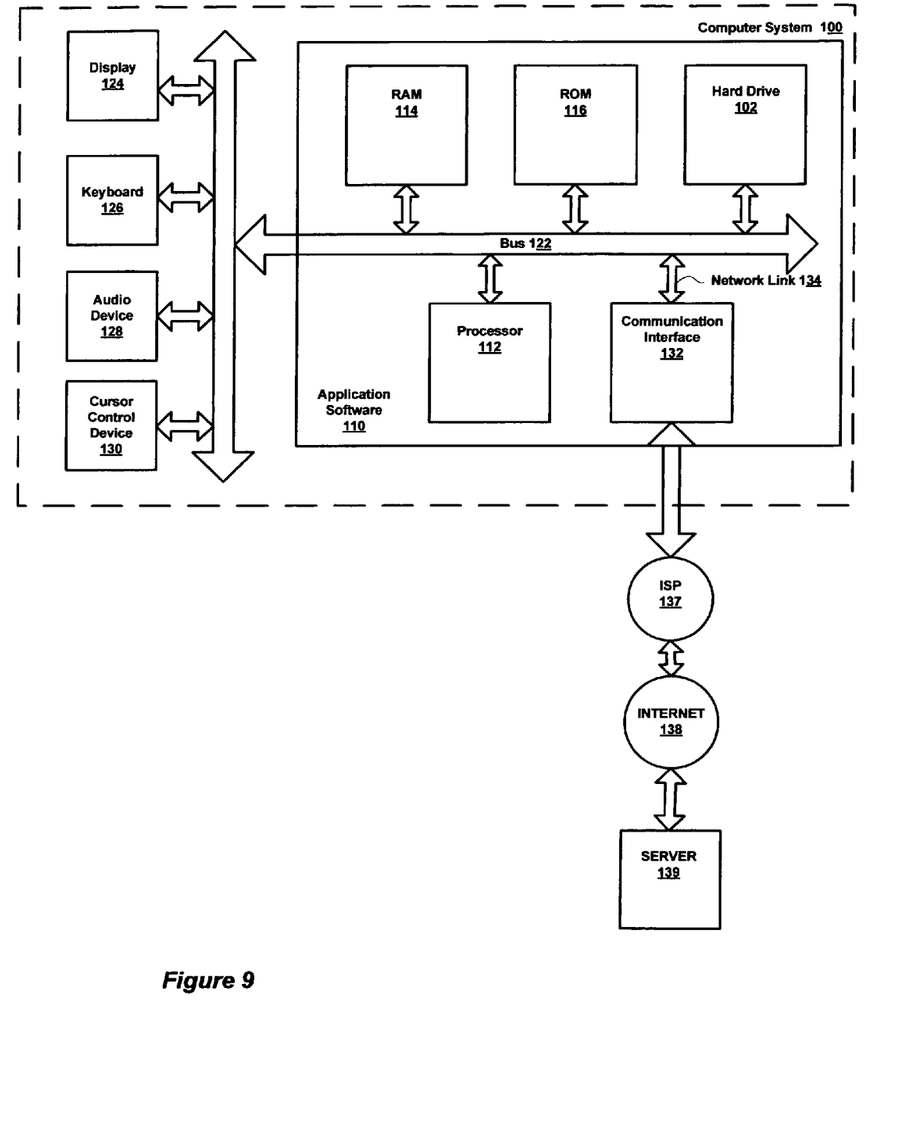
FIG. 9 is a block diagram illustrating a computer system that can be used to implement a preferred embodiment of the present invention.

Reference now being made to FIG. 9, a block diagram is shown illustrating a computer system 900 that can be used to implement a preferred embodiment of the present invention. Computer System 100 includes various components each of which are explained in greater detail below.

Bus 122 represents any type of device capable of providing communication of information within Computer System 100 (e.g., System bus, PCI bus, cross-bar switch, etc.)

Processor 112 can be a general-purpose processor (e.g., the PowerPC™ manufactured by IBM or the Pentium™ manufactured by Intel) that, during normal operation, processes data under the control of an operating system and application software 110 stored in a dynamic storage device such as Random Access Memory (RAM) 114 and a static storage device such as Read Only Memory (ROM) 116. The operating system preferably provides a graphical user interface (GUI) to the user.

The present invention, including the alternative preferred embodiments, can be provided as a computer program product, included on a machine-readable medium having stored on it machine executable instructions used to program computer system 100 to perform a process according to the teachings of the present invention.

The term "machine-readable medium" as used in the specification includes any medium that participates in providing instructions to processor 112 or other components of computer system 100 for execution. Such a medium can take many forms including, but not limited to, non-volatile media, and transmission media. Common forms of non-volatile media include, for example, a floppy disk, a flexible disk, a hard disk, magnetic tape, or any other magnetic medium, a Compact Disk ROM (CD-ROM), a Digital Video Disk-ROM (DVD-ROM) or any other optical medium whether static or rewriteable (e.g., CDRW and DVD RW), punch cards or any other physical medium with patterns of holes, a programmable ROM (PROM), an erasable PROM (EPROM), electrically EPROM (EEPROM), a flash memory, any other memory chip or cartridge, or any other medium from which computer system 100 can read and which is suitable for storing instructions. In the preferred embodiment, an example of a non-volatile medium is the Hard Drive 102.

Volatile media includes dynamic memory such as RAM 114. Transmission media includes coaxial cables, copper wire or fiber optics, including the wires that comprise the bus 122. Transmission media can also take the form of acoustic or light waves, such as those generated during radio wave or infrared data communications.

Moreover, the present invention can be downloaded as a computer program product where the program instructions can be transferred from a remote computer such as server 139 to requesting computer system 100 by way of data signals embodied in a carrier wave or other propagation medium via network link 134 (e.g., a modem or network connection) to a communications interface 132 coupled to bus 122.

Communications interface 132 provides a two-way data communications coupling to network link 134 that can be connected, for example, to a Local Area Network (LAN), Wide Area Network (WAN), or as shown, directly to an Internet Service Provider (ISP) 137. In particular, network link 134 may provide wired and/or wireless network communications to one or more networks.

ISP 137 in turn provides data communication services through the Internet 138 or other network. Internet 138 may refer to the worldwide collection of networks and gateways that use a particular protocol, such as Transmission Control Protocol (TCP) and Internet Protocol (IP), to communicate with one another. ISP 137 and Internet 138 both use electrical, electromagnetic, or optical signals that carry digital or analog data streams. The signals through the various networks and the signals on network link 134 and through communication interface 132, which carry the digital or analog data to and from computer system 100, are exemplary forms of carrier waves transporting the information.

In addition, multiple peripheral components can be added to computer system 100. For example, audio device 128 is attached to bus 122 for controlling audio output. A display 124 is also attached to bus 122 for providing visual, tactile or other graphical representation formats. Display 124 can include both non-transparent surfaces, such as monitors, and transparent surfaces, such as headset sunglasses or vehicle windshield displays.

A keyboard 126 and cursor control device 130, such as mouse, trackball, or cursor direction keys, are coupled to bus 122 as interfaces for user inputs to computer system 100.

Application software 110 represents CAD software that implements the diffusion based model for cell placement migration as described herein.

It is thus believed that the operation and construction of the present invention will be apparent from the foregoing description. While the method and system shown and described has been characterized as being preferred, it will be readily apparent that various changes and/or modifications could be made without departing from the spirit and scope of the present invention as defined in the following claims.

What is claimed is:

1. A computer-performed method of placing cells in an integrated circuit design, the method comprising the steps of: within a computer system, defining bin locations for the design, the bin locations having a predetermined size and shape;

calculating a density value for the bin locations according to the number of cells located within the corresponding bin location;

calculating a simulated diffusion velocity for the cells using the density values of the bin locations;

moving the cells according to their calculated diffusion velocity until the density value of the bin locations is less than or equal to a predetermined density, wherein a differing diffusion velocity calculated for the cells causes relocation of the cells at a different rate whereby cells located in higher density bin locations are moved farther in a given time period than cells located in lower density bin locations; and storing a result of the moving in a memory of the computer system.

2. The method of claim 1, further comprising the step of: modifying the density value of each bin location that is lower than the predetermined density so that the average density of all bin locations is less than or equal to the predetermined density.

3. The method of claim 2, wherein the step of modifying the density value of each bin includes the step of:

modifying the density value of each bin location residing on a fixed block or boundary so that cells are not moved into the fixed block or boundary by the moving.

4. The method of claim 3, wherein the step of calculating the velocity includes the step of calculating the velocity for each one of the cells using interpolation.

5. The method of claim 4, wherein interpolation includes calculating the velocity of a cell according to the velocities of four bin centers that are closest to the cell.

6. The method of claim 5, wherein the step of moving the cells includes the step of moving the cells according to their calculated velocity for a predetermined time period.

7. A computer-performed method of controlling placement of cells in an integrated circuit design comprising:

partitioning the integrated circuit design into a number of bins having a predetermined shape and size;

calculating, within a computer system, a corresponding density value for the bins according to the number of cells in the corresponding bin;

determining corresponding velocity values for the cells according to the density value of the bins, by interpolating between multiple bin density values;

moving the cells during predetermined time interval according to their corresponding velocity values, wherein the cells are relocated at a rate determined by their corresponding velocities, whereby cells located in bins having a high density value are relocated at a higher rate than other cells located in bins having a lower density value; and storing a result of the moving in a memory of the computer system.

\* \* \* \* \*